United States Patent
Lai et al.

(10) Patent No.: US 7,964,949 B2
(45) Date of Patent: Jun. 21, 2011

(54) TENON-AND-MORTISE PACKAGING STRUCTURE

(75) Inventors: Yi-Shao Lai, Taipei (TW); Tsung-Yueh Tsai, Kaohsiung (TW); Hsiao-Chuan Chang, Kaohsiung (TW); Tsan-Hsien Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 183 days.

(21) Appl. No.: 12/216,637

(22) Filed: Jul. 9, 2008

(65) Prior Publication Data

US 2009/0096077 A1 Apr. 16, 2009

(30) Foreign Application Priority Data

Oct. 16, 2007 (TW) ................................ 96138714 A

(51) Int. Cl.
*H01L 23/02* (2006.01)
(52) U.S. Cl. .................. 257/686; 257/777; 257/E23.18
(58) Field of Classification Search .......... 257/685–686, 257/700, 750, 758, E23.18, 777, 687
See application file for complete search history.

(56) References Cited

U.S. PATENT DOCUMENTS

2007/0155048 A1* 7/2007 Lee et al. ...................... 438/106
* cited by examiner

*Primary Examiner* — Tom Thomas
*Assistant Examiner* — Hoa B Trinh
(74) *Attorney, Agent, or Firm* — Bacon & Thomas, PLLC

(57) ABSTRACT

A tenon-and-mortise packaging structure including a carrier and a chip is provided. The carrier has a top surface and a lower surface opposite to the top surface. The top surface forms at least one tenon projection, and the lower surface forms a mortise slot corresponding to the tenon projection in shape, size, and position, so that two carriers can be stacked on and jointed to each other by coupling the tenon projection to the corresponding mortise slot. The tenon projection and the mortise slot have conduction portions, respectively. When the tenon projection and the mortise slot are engaged with each other, the conduction portions are electrically connected with each other. At least one chip is embedded in the carrier. The chip has an active surface and a back side respectively and electrically connected with the top and the lower surfaces of the carrier.

12 Claims, 4 Drawing Sheets

TENON-AND-MORTISE PACKAGING STRUCTURE

This application claims the benefit of Taiwan application Serial No. 96138714, filed Oct. 16, 2007, the subject matter of which is incorporated herein by reference.

BACKGROUND OF THE INVENTION

1. Field of the Invention

The invention relates in general to a tenon-and-mortise packaging structure and a manufacturing method thereof, and more particularly to a packaging structure which achieves precise positioning of stacked package by a CIP package.

2. Description of the Related Art

With the rapid progress in electronic products, the integrated circuit (IC) has become an indispensible product in information age and has been widely used in electronic devices such as notebook computer, mobile phone, personal digital assistant (PDA) and digital camera. In terms of the chip package structure of an electronic product, the electronic product must not only have as many active elements as possible to meet the requirements of multi-function and high-speed and high-frequency operation but meet the requirements of lightweight, slimness and compactness.

Currently, many IC packages, such as flip chip package, quad flat package, ball grid array and chip in polymer (CIP) package, are provided to accommodate a large number of electronic elements in a limited package space. The flip chip package is formed with the die facing downward and coupled to the substrate via a solder. The quad flat package (QFP) is formed via supporting the package structure with a metallic wire frame and connecting with a circuit board via the leads on two surfaces or four edges. The ball grid array (BGA) is connected with a circuit board via a solder ball. According to the CIP package, super-thin chips are embedded in the build-up layers of a printed circuit board. Firstly, the chip is placed on the substrate. Next, a dielectric material is used to form a dielectric layer and the chip is embedded in the dielectric layer. Then, a plurality of metallic wires is fabricated on the dielectric material by the way of electroplating for electrically connecting the chip to the substrate. However, the problem in the manufacturing process of CIP package is the yield rate to be desided by uniformity of the dielectric layer. As the dielectric layer is formed via spin-coating and then bring about a micro-porous structure after exposure and developing process, the uniformity of the dielectric layer becomes very hard to control during the manufacturing process, hence affecting the yield rate of CIP package. Furthermore, on the part of a stacked package, a plurality of embedded chips is fixed with an adhesive so as to form a stacked package. However, after repeated heating cycling in the manufacturing process, the adhesive may be detached and come off. Besides, during the stacking process, the yield rate of the package will be affected if the substrates are not positioned precisely. Therefore, the invention provides a new type of semiconductor chip package structure and method thereof to resolve the above problems.

SUMMARY OF THE INVENTION

The invention is directed to a tenon-and-mortise packaging structure, a tenon projection and its corresponding mortise which are disposed on two opposite surfaces of a substrate are engaged together to ensure that elements are positioned precisely and defects in positioning are avoided.

According to a first aspect of the present invention, a tenon-and-mortise packaging structure is provided. A tenon projection and a corresponding mortise slot are formed on two opposite surfaces of a substrate for coupling two or more substrates to form a stacked package structure. Also, a plurality of conduction portions are electroplated on the surface of the tenon projection and the inner side of the mortise slot for electrically connecting between the substrates of a stacked package structure when the substrates are jointed to each other by coupling the tenon projections to a corresponding mortise slots, without additional device for electrical connection, hence largely reducing the circuit required space.

According to a second aspect of the present invention, a tenon-and-mortise packaging structure including a substrate is provided. The substrate has a top surface and a corresponding lower surface. The top surface forms at least one tenon projection, and the lower surface forms at least one mortise slot corresponding to the tenon projection in shape and position. When the two substrates are stacked on each other, the tenon projection can be inserted into the mortise slot and engaged with the mortise slot through the interference for coupling the two substrates together to form a stacked structure. In other words, according to the invention, two substrates are precisely positioned by the engaging mechanism between the mortise slot and the tenon projection which are disposed on the top and the lower surfaces of the substrate, hence avoiding the defects in positioning which may occur when the substrates are stacked on one another by an adhesive according to generally known techniques.

According to a third aspect of the present invention, a tenon-and-mortise packaging structure including a plurality of substrates is provided. Each substrate has a top surface and a lower surface opposite to the top surface. The top and the lower surfaces of the substrate respectively form a mortise slot and a tenon projection. A plurality of substrates can be stacked on one another and jointed to each other to form a stacked package by coupling the mortise slot to a tenon projection. The inner and outer surfaces of the mortise slot and the tenon projection are respectively electroplated with a conduction portion for electrically connecting two neighboring substrates when the substrates are vertically stacked on one another to form a stacked package by coupling the mortise slot to the tenon projection, largely reducing the required circuit space for the stacked package and enhancing the electrical properties.

According to a fourth aspect of the present invention, a tenon-and-mortise packaging structure including a carrier is provided. The carrier has a top surface and a lower surface opposite to top surface. The top and the lower surfaces of the carrier respectively form a mortise slot and a tenon projection corresponding to the mortise slot in shape and position. A chip, embedded in the carrier by the way of vacuum, has an active surface and a back side opposite to the active surface. The active surface of the chip is eclectically connected with the tenon projection disposed on the top surface of the carrier via a plurality of wires embedded in the carrier. The back side of the chip is also electrically connected with the mortise slot disposed on the lower surface of the carrier via the wires embedded in the carrier. As the chip is embedded in the carrier by the way of vacuum and is electrically connected with the top and the lower surfaces of the carrier via the wires embedded in the carrier, there is no need to provide a dielectric layer disposed between the chip and the carrier, hence avoiding the non-uniformity problem of spin-coating the dielectric layer which occurs when conventional techniques are employed thus increasing the yield rate of CIP package.

A stacked package with precise positioning is formed via coupling a mortise slot and a corresponding tenon projection which are disposed on two opposite surfaces of a substrate (carrier) so that defects in positioning are avoided, the space required for forming electrical connection in the stacked package is reduced, the electrical properties are enhanced, and the volume of the package structure is reduced. As the dielectric layer is dispensed, the stacked package formed by the tenon-and-mortise packaging structure of the invention is free of the non-uniformity problem which occurs when the dielectric layer is spin-coated.

The invention will become apparent from the following detailed description of the preferred but non-limiting embodiments. The following description is made with reference to the accompanying drawings.

DETAILED DESCRIPTION OF THE INVENTION

Figure 1:
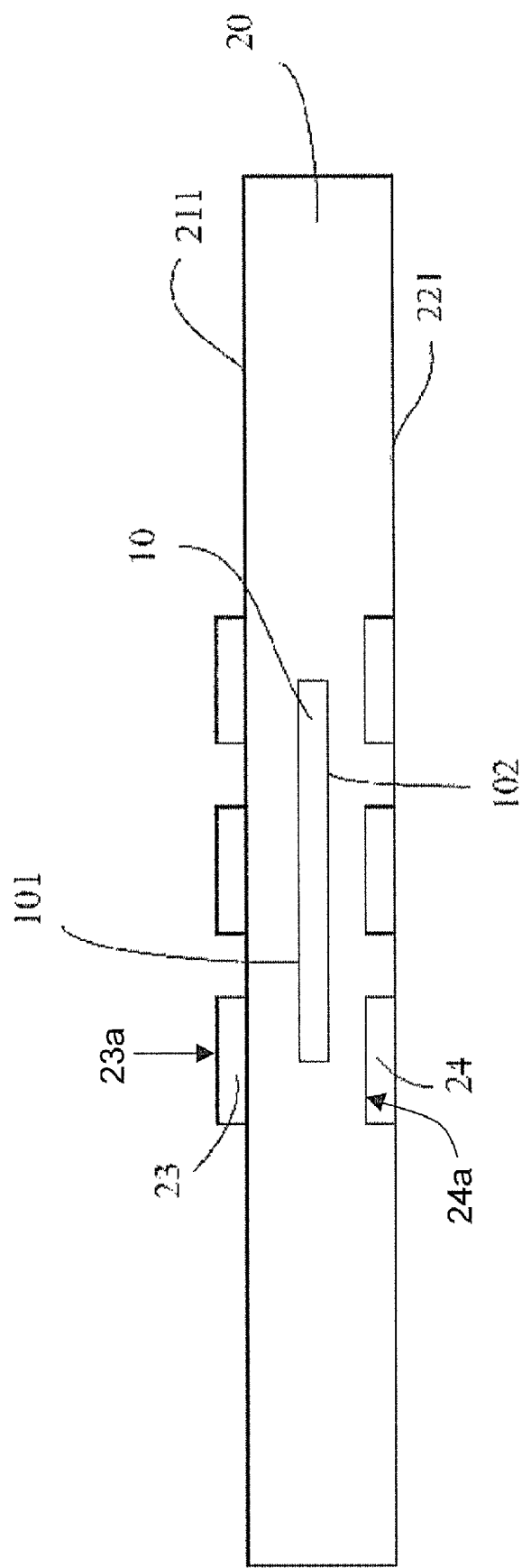
FIG. 1 shows a perspective of a tenon-and-mortise packaging structure of according to a preferred embodiment of the invention.

The tenon-and-mortise packaging structure of the invention is disclosed below with accompanying drawings. FIG. 1 shows a perspective of a tenon-and-mortise packaging structure according to a preferred embodiment of the invention. As indicated in FIG. 1, the tenon-and-mortise packaging structure includes a carrier 20 exemplified as a substrate in the present embodiment of the invention. However, the carrier 20 is not limited to a substrate and can be implemented by any suitable structures or components.

The carrier 20 has a top surface (or top surface 211) and a bottom surface (or lower surface 221) opposite to the top surface. The defining words "top" and "lower" refer to the relative position in the related drawings and are irrelevant to actual position of the carrier 20 or the tenon-and-mortise packaging structure of the invention. In the present embodiment of the invention, the top surface 211 opposite to the lower surface 221, and it is only one of the implementations of the invention, and the surfaces in the invention are not limited to be opposite.

According to a perspective of the invention, the top surface 211 forms a tenon projection 23, and the lower surface 221 forms a mortise slot 24. The tenon projection 23 and the mortise slot 24 correspond to each other in shape and position so that the tenon projection 23 disposed on the carrier 20 can be inserted into and engaged with the mortise slot 24 disposed on another carrier, and two carriers 20 can be stacked on each other as to form a stacked packaging structure.

In the present embodiment of the invention, the tenon projection 23 has a upper surface and many outer wall surfaces of the laterals, and in responding to such outer surface of the tenon projection 23, the mortise slot 24 also has corresponding bottom surface and inner wall surfaces of the laterals. When a tenon projection 23 of the carrier 20 is inserted into the mortise slot 24 of another carrier 20, the upper surface of the tenon projection 23 is engaged with the bottom surface of the mortise slot 24, and the outer wall surfaces of the tenon projection 23 are engaged with the inner wall surfaces of the mortise slot 24.

According to another perspective of the invention, at least one of upper surface and the outer wall surfaces of the tenon projection 23 form a first conduction portion 23a preferably made from a metallic material such as gold, silver, copper or an alloy thereof or any other suitable materials. The first conduction portion 23a can be disposed on the upper surface or the outer wall surfaces of the tenon projection 23 by any suitable methods such as electroplating or other generally known techniques. Furthermore, the bottom surface and the inner wall surfaces of the mortise slot 24 also form a second conduction portion 24a corresponding to the first conduction portion 23a of the tenon projection 23. The second conduction portion 24a is disposed in the mortise slot 24 in response to the first conduction portion 23a disposed on the tenon projection 23. Thus, when the tenon projection 23 of the carrier 20 is inserted into the mortise slot 24 of another carrier 20, the first conduction portion 23a disposed on the tenon projection 23 contacts and is electrically connected with the second conduction portion 24a disposed in the mortise slot 24.

Like the first conduction portion 23a disposed on the tenon projection 23, the second conduction portion 24a disposed in the mortise slot 24 can be made from any suitable conductive materials. In the present embodiment of the invention, the conduction portion is preferably made from a metallic material such as gold, silver, copper or an alloy thereof or any other suitable materials. The second conduction portion 24a can be disposed on the bottom surface or the inner wall surfaces of the mortise slot 24 by any suitable methods such as electroplating or other generally known techniques. Besides, in the invention, the first conduction portion 23a and the second conduction portion 24a are not necessarily made from the same material. However, for the convenience of manufacturing, the first conduction portion 23a and the second conduction portion 24a are preferably made from the same material.

The tenon-and-mortise packaging structure of the invention further includes a chip 10 embedded in the carrier 20. The chip 10 has an active surface 101 and a back side 102 opposite to the active surface 101. The chip 10 is disposed in the carrier 20 so that the active surface 101 is electrically connected with the tenon projection 23 of the carrier 20, and the back side 102 of the chip 10 is electrically connected with the mortise slot 24 of the carrier 20. The electrical connection between the active surface 101 and the tenon projection 23 and the electrical connection between the back side 102 and the mortise slot 24 can be achieved by any suitable methods. In a preferred embodiment of the invention, the electrical connection between these components can be achieved via the wires (not illustrated) embedded in the carrier 20. That is, the active surface 101 (or back side 102) of the chip 10 and the tenon projection 23 (or mortise slot 24) of the carrier 20 are connected and electrically connected via the wires embedded in the carrier 20. In the preferred embodiment of the invention, the wires are made from a metal such as gold, silver, copper or an alloy thereof.

As indicated in the embodiment disclosed in the drawings, the top surface 211 and the lower surface 212 of the carrier 20 are opposite and parallel to each other, the chip 10 is embedded in the carrier 20 so that the active surface 101 is opposite to the top surface 211, and the back side 102 is opposite to the lower surface 212. In a preferred embodiment, the active surface 101 and the back side 102 of the chip 10 are disposed in parallel and are also parallel to the top surface 211 and the lower surface 212 of the carrier 20. In other words, the chip 10 is substantially parallel to the carrier 20. However, such arrangement is only one of the implementations of the invention, and the invention can be implemented by other types of arrangements.

Figure 2:
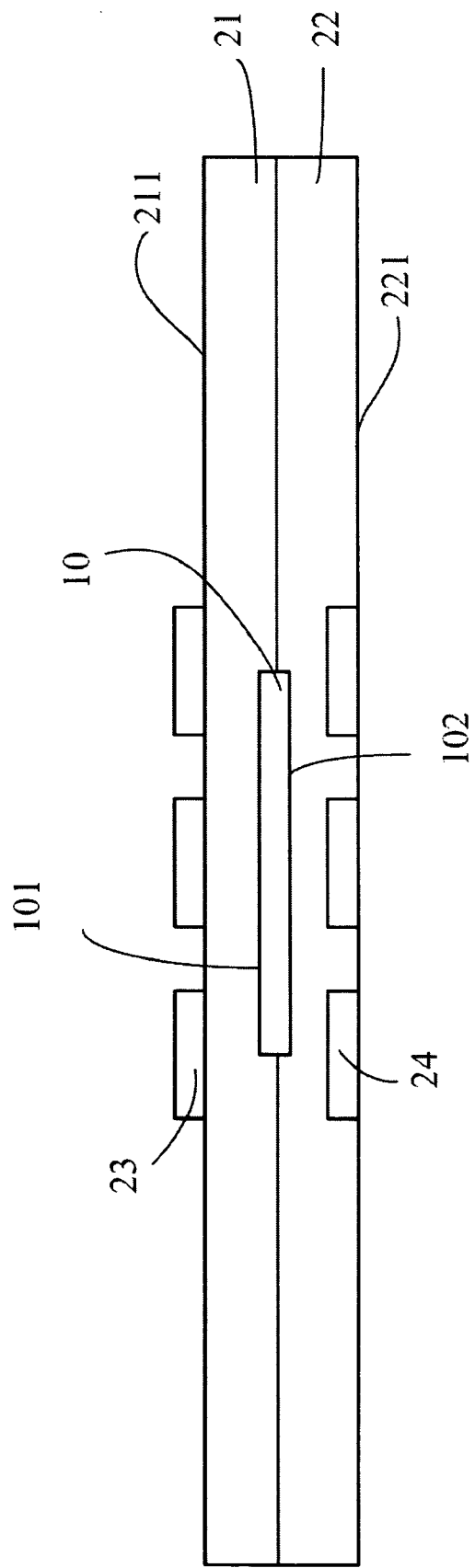
FIG. 2 shows a perspective of manufacturing process of a tenon-and-mortise packaging structure according to a preferred embodiment of the invention.

Referring to FIG. 2, a perspective of manufacturing process of a tenon-and-mortise packaging structure according to a preferred embodiment of the invention. As indicated in FIG. 2, the carrier 20 includes the first carrying plate 21 and the second carrying plate 22. The first carrying plate 21 and the second carrying plate 22 all have an inner and an outer surface opposite to the inner surface, and the first carrying plate 21 and the second carrying plate 22 are designed in a manner that their inner surfaces are pasted together and contain the chip 10 within so that the chip 10 is completely embedded in the carrier 20 formed by the first and the second carrying plates 21 and 22. The outer surface of the first and the second carrying plates 21 and 22 respectively form the top surface 211 and the lower surface 212 of the carrier 20. In the embodiment illustrated in FIG. 2, the outer surface of the first carrying plate 21 forms the top surface 211 of the carrier 20, and the outer surface of the second carrying plate 22 forms the lower surface 212 of the carrier 20. However, the embodiment of the invention is not limited to such arrangement. The first carrying plate 21 and the second carrying plate 22 can be coupled together according to other suitable methods.

Figure 3:
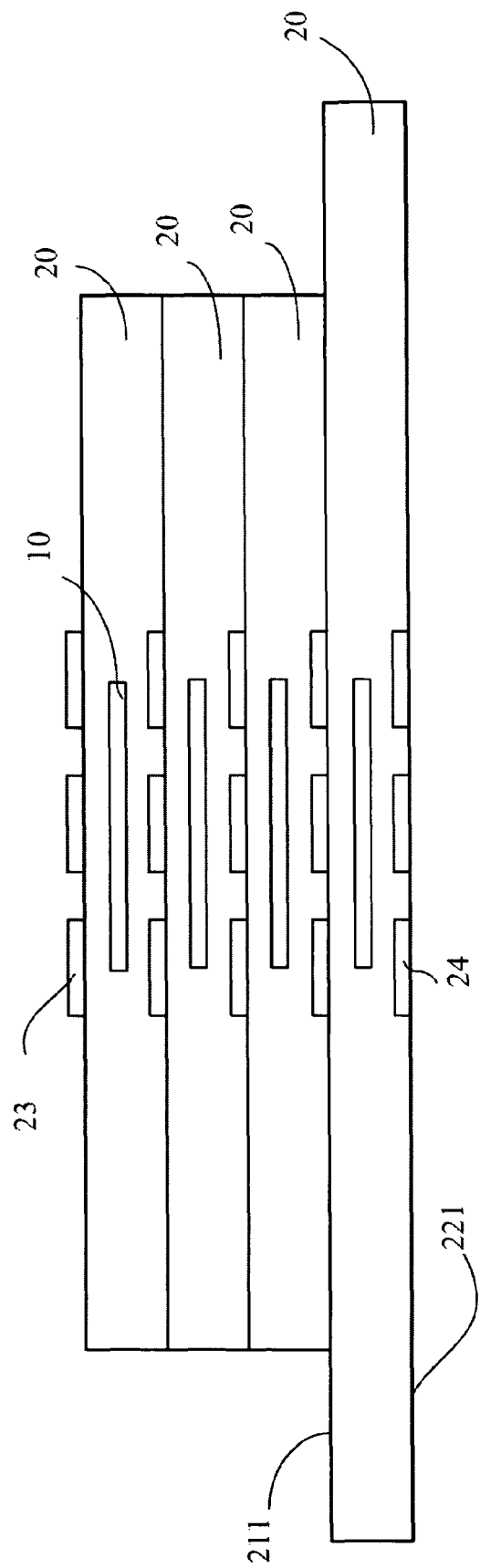
FIG. 3 shows a perspective of a stacked package structure formed by stack of a plurality of tenon-and-mortise packaging structures according to a preferred embodiment of the invention.

Referring to FIG. 3, a perspective of a stacked package structure formed by stack of a plurality of tenon-and-mortise packaging structures according to a preferred embodiment of the invention is shown. Each carrier 20 has a top surface 211 and a lower surface 221 opposite to top surface 211. The top surface 211 forms at least one tenon projection 23, and the lower surface 221 forms at least one mortise slot 24 corresponding to the at least one tenon projection 23. Thus, when two neighboring carriers 20 are stacked on each other by the top surface facing the lower surface, the tenon projection 23 disposed on the top surface 211 of one carrier 20 is inserted into and engaged with the mortise slot 24 disposed on the lower surface 221 of another carrier 20 to form a stacked package. By the way of coupling the mortise slot 24 to the tenon projection 23 of two carriers 20, the two carriers 20 are positioned more precisely, hence improving the yield rate of packaging structure. Anyone who is skilled in the technology of the invention will understand that the tenon projection 23 and the mortise slot 24 can be disposed in any suitable manners. For example, the tenon projection 23 and the mortise slot 24 disposed on the top surface and the lower surface of the carrier 20 do not need to have the same number and position, and the shape does not have to be complementary or the same, but the tenon projection 23 and the mortise slot 24 disposed on the top and the lower surfaces of adjacent carriers 20 must be corresponding to each other in shape, position and quantity so that the tenon projection 23 and the mortise slot 24 can be coupled together. However, for the convenience of manufacturing, the tenon projection 23 and the mortise slot 24 preferably have the same quantity and correspond to each other in terms of position and shape.

Besides, the upper surface and the outer wall surfaces of the laterals of each tenon projection 23 form a first conduction portion, and the bottom surface and the inner wall surfaces of the laterals of each mortise slot 24 form a second conduction portion. The first and the second conduction portions will contact and be electrically connected with each other when two neighboring carriers 20 are bound together by inserting the tenon projection 23 into the mortise slot 24. Thus, two vertically stacked carriers 20 are electrically connected with each other without using additional electrical connection component or parts, hence simplifying the overall structure, reducing the required space, and enhancing the electrical properties for the stacked package.

The first conduction portion and the second conduction portion can be disposed on the tenon projection 23 and the mortise slot 24 in different manners. For example, the first conduction portion and the second conduction portion can only cover particular portion of the tenon projection 23 and the mortise slot 24 or completely cover the surface of the tenon projection 23 and the only mortise slot 24, or the conduction portion covers the surface of one of the tenon projection 23 and the mortise slot 24 and covers a particular portion of the other one of the tenon projection 23 and the mortise slot 24. However, the invention can be implemented by different arrangements as long as the electrical connection between the tenon projection 23 and the mortise slot 24 is firm and stable.

As disclosed above, each carrier 20 has at least one chip 10 which is completely embedded in the carrier 20. The active surface 101 and the back side 102 of each chip 10 is electrically connected with the tenon projection 23 and the mortise slot 24 disposed on the top surface 211 and the lower surface 212 of the carrier 20 via a suitable conduction component such as a plurality of wires (not illustrated) embedded in the carrier. Thus, when a plurality of carriers 20 are stacked on one another as to form a stacked package, the chip 10 of the carrier 20 can be electrically connected to the chip 10 of an adjacent carrier 20 via the electrical connection between the mortise slot 24 and the tenon projection 23, hence largely reducing the space required for the electrical connection of the stacked package and enhancing the overall electrical properties.

As indicated in FIG. 3, the carriers 20 stacked on one another without having the same size and shape would also do and as long as the tenon projection 23 and the mortise slot 24 disposed on the top and the lower surfaces of the carriers correspond to each other in quantity and positions.

Figure 4:
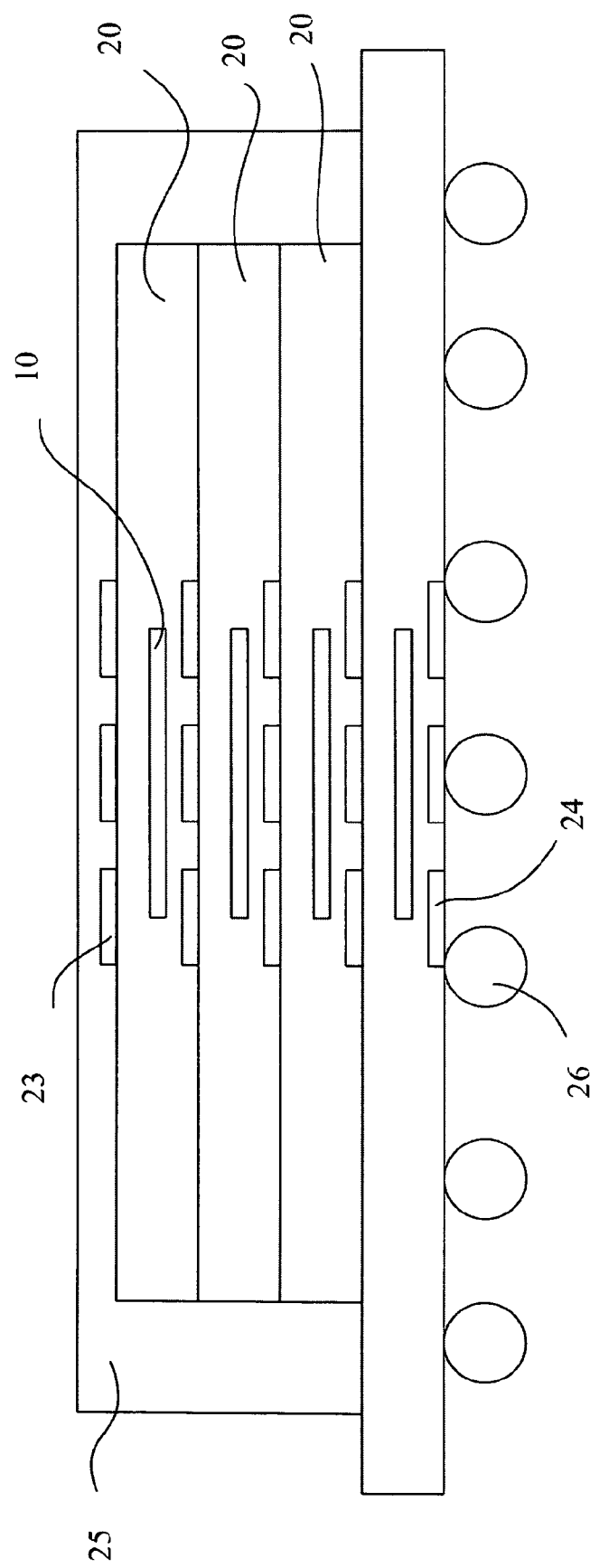
FIG. 4 shows a perspective of a stacked package structure formed by stack of a plurality of the tenon-and-mortise packaging structure of the invention after packaging process.

Referring to FIG. 4, a perspective of the stacked structure of FIG. 3 after packaging process is shown. As indicated in FIG. 4, the stacked structure formed by the carriers 20 can use resin or other suitable materials in packaging process. In other words, the top surface 211 of the topmost carrier 20 of the stacked structure can form an encapsulant 25 extending to the edge of the stacked structure for covering the carriers 20. According to the embodiment disclosed in FIG. 4, the lowermost carrier 20 of the stacked structure formed by stack of a plurality of carriers 20 has a surface area which is larger than other carriers, so that the encapsulant 25 can build up on the lowermost carrier to package all carriers 20 while the encapsulant 25 is extending downward along the edges of the stacked structure.

If necessary, the lower surface 221 of the lowermost carrier 20 of the stacked package structure can form a plurality of solder balls 26 for electrically connecting the stacked package to outer devices. The solder balls 26 can be disposed in the mortise slot 24 on the lower surface 221 or other suitable position on the lower surface 221, and then the solder balls 26 are connected with the chip in the lowermost carrier 20 via suitable conduction device or components. The disposition of the solder balls 26 is a generally known technique and is not repeated here.

To summarize, the tenon-and-mortise packaging structure disclosed in the invention not only avoids the decrease in the yield rate of packaging structure caused by poor uniformity of spin-coating the dielectric layer of an embedded chip but also forms a stacked structure by coupling the mortise slot and the tenon projection respectively disposed on the top surface and the lower surface of two carriers. Moreover, as the surface of the tenon projection and the surface of the mortise slot are both electroplated with a conduction portion, the electrical connection of the stacked package structure is achieved and the electrical properties of the package are enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A tenon-and-mortise packaging structure, comprising:
   a carrier having a top surface on which at least one tenon projection having a first conduction portion is formed and a bottom surface on which a mortise slot corresponding to the tenon projection in shape is formed so that the mortise slot of the carrier and another tenon projection of another carrier can be engaged with each other, and the mortise slot of the carrier has a second conduction portion for contacting and electrically connecting with the first conduction portion of the another tenon projection when the another tenon projection of the another carrier is inserted into the mortise slot of the carrier; and
   at least one chip embedded in the carrier and having an active surface and a back side, wherein the active surface of the chip is electrically connected with the first conduction portion, and the back side of the chip is electrically connected with the second conduction portion.

2. The tenon-and-mortise packaging structure according to claim 1, wherein the carrier and the chip are configured to be parallel.

3. The tenon-and-mortise packaging structure according to claim 1, wherein the active surface and the back side of the chip respectively are electrically connected with the tenon projection and the mortise slot of the carrier so that the chip is electrically connected with the tenon projection and the mortise slot of the carrier.

4. The tenon-and-mortise packaging structure according to claim 1, wherein an encapsulant for covering the carrier is disposed on the top surface of the carrier.

5. A tenon-and-mortise packaging structure, comprising:
   a plurality of carriers including a first carrier and a second carrier, the first and second carriers each having a top surface on which at least one tenon projection is formed and a lower surface on which a mortise slot corresponding to the tenon projection in shape is formed so that the mortise slot of the second carrier and the tenon projection of the first carrier are engaged with each other for fixing and precisely positioning the second carrier when the first and second carriers are stacked on each other, the tenon projection of the first carrier has a first conduction portion disposed thereon, and the mortise slot of the second carrier has a second conduction portion disposed thereon for contacting and electrically connecting with the first conduction portion when the tenon projection of the first carrier is inserted into the mortise slot of the second carrier; and
   a plurality of chips respectively embedded in the first and second carriers, wherein each of the chips has an active surface and a back side, the active surface of each of the chips is electrically connected with the tenon projection of a related carrier, and the back side of each of the chips is electrically connected with the mortise slot of a related carrier.

6. The tenon-and-mortise packaging structure according to claim 5, wherein each of the first and second carriers and each of the chips disposed therein are configured to be parallel.

7. The tenon-and-mortise packaging structure according to claim 5, wherein the mortise slot of the second carrier and the tenon projection of the first carrier are engaged with each other so as to be electrically connected with the first and second carriers.

8. The tenon-and-mortise packaging structure according to claim 5, wherein the active surface and the back side of a first chip of the chips are respectively electrically connected with the tenon projection of the first carrier and the mortise slot of the second carrier.

9. The tenon-and-mortise packaging structure according to claim 5, wherein the first and second carriers have a topmost carrier whose top surface is covered by an encapsulant, and the first and second carriers have a lowermost carrier whose lower surface has a plurality of solder balls.

10. a tenon-and-mortise packaging structure, comprising:
    a first carrier, having a first top surface on which a first tenon projection is formed and a first lower surface on which a first mortise slot corresponding to the first tenon projection in shape is formed;
    a second carrier, stacked on the first top surface of the first carrier and having a second top surface on which a second tenon projection is formed and a second lower surface on which a second mortise slot corresponding to the second tenon projection in shape is formed, so that the first top surface of the first carrier and the second bottom surface of the second carrier are substantially gapless, and the first tenon projection and the second mortise slot are engaged with each other when the first and second carriers are stacked to form a stacked structure;
    a plurality of chips respectively embedded in the first and second carriers; and
    an encapsulant, covering the second carrier and exposing the first bottom surface of the first carrier.

11. The tenon-and-mortise packaging structure according to claim 10, wherein the first and second carriers and the chips are configured to be parallel.

12. The tenon-and-mortise packaging structure according to claim 10, wherein a first chip of the chips is electrically connected with the first tenon projection and the first mortise slot of the first carrier, and a second chip of the chips is electrically connected with the second tenon projection and the second mortise slot of the second carrier.

* * * * *